United States Patent
Chen et al.

(10) Patent No.: US 10,345,845 B1
(45) Date of Patent: Jul. 9, 2019

(54) FAST SETTLING BIAS CIRCUIT

(71) Applicant: Cadence Design Systems, Inc., San Jose, CA (US)

(72) Inventors: Ling Chen, Shanghai (CN); Fuyue Wang, Shanghai (CN); Thomas Evan Wilson, Laurel, MD (US); Jianyun Zhang, Shanghai (CN); Eric Harris Naviasky, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/943,499

(22) Filed: Apr. 2, 2018

(51) Int. Cl.
| | |
|---|---|
| *G05F 3/16* | (2006.01) |
| *H03M 1/46* | (2006.01) |
| *H03F 1/30* | (2006.01) |
| *H03M 1/38* | (2006.01) |

(52) U.S. Cl.
CPC .............. *G05F 3/16* (2013.01); *H03F 1/305* (2013.01); *H03M 1/38* (2013.01); *H03M 1/46* (2013.01); *H03M 1/466* (2013.01); *H03M 1/468* (2013.01)

(58) Field of Classification Search
CPC .......... G05F 3/16; H03F 1/305; H03M 1/466; H03M 1/38; H03M 1/46; H03M 1/468
See application file for complete search history.

(56) References Cited

U.S. PATENT DOCUMENTS

| | | | |
|---|---|---|---|
| 6,091,281 A | 7/2000 | Yoshida | |
| 6,999,745 B2 | 2/2006 | Leenaerts | |
| 7,212,051 B1 | 5/2007 | Zhu et al. | |
| 9,154,151 B1 * | 10/2015 | Leong | H03M 1/0863 |
| 2009/0115473 A1 | 5/2009 | Choi et al. | |
| 2011/0012652 A1 | 1/2011 | Lamanna et al. | |
| 2011/0156760 A1 | 6/2011 | Bhuiyan | |
| 2013/0257497 A1 | 10/2013 | Thelen et al. | |
| 2014/0159776 A1 | 6/2014 | Elran | |

OTHER PUBLICATIONS

"U.S. Appl. No. 15/943,487, Notice of Allowance dated Sep. 26, 2018", 9 pgs.
U.S. Appl. No. 15/943,491, Non-Final Office Action dated Apr. 15, 2019, 6 pgs.

* cited by examiner

*Primary Examiner* — Jung Kim
(74) *Attorney, Agent, or Firm* — Schwegman Lundberg & Woessner, P.A.

(57) ABSTRACT

Aspects of the present disclosure include systems, methods, devices, and circuits for fast settling of a bias node. Consistent with some embodiments, a bias circuit may include a successive-approximation-register-analog-to-digital converter (SAR-ADC) based settling loop configured to perform a fast settling process for a heavily loaded bias node. The SAR-ADC based loop performs a SAR-ADC process that includes measuring a reference signal to determine a number of cells in a capacitor array that are involved in a charge sharing process while simultaneously completing the settling process for the bias node.

19 Claims, 5 Drawing Sheets

US 10,345,845 B1

FAST SETTLING BIAS CIRCUIT

TECHNICAL FIELD

The present disclosure generally relates to integrated circuit (IC) design. In particular, the present disclosure addresses a fast settling bias circuit.

BACKGROUND

Bias circuits are widely employed in analog or mixed signal electronic circuitry to set operating conditions by establishing a predetermined voltage at a given node. Typically, maintaining a bias node at a desired voltage consumes power. Therefore, bias circuits are often disabled in low-power or power-down operating states. A bias circuit may also require a length of time to generate a steady state voltage at the bias node, and the length of time may be related to power consumption and noise filtering.

Conventional bias circuits exhibit a number of limitations. As low power operation of electronic circuits becomes increasingly important, the capability to enter the lowest power state whenever possible becomes essential. Conventionally, bringing the bias circuits back online is a major limitation of quickly returning to an operational power state. This is often due to the fact that, in order to minimize any possible noise injection, bias nodes are often heavily bypassed to a supply rail. Additionally, large current surges in the supply network will likely induce ringing, further complicating a power-up of the circuit.

Power is consumed maintaining a steady-state voltage on a node that is not equal to a supply rail. For example, if the power supply is 1.0V and the ground return is 0V, then at least some on-chip power is consumed in the process of generating a non-rail voltage, such as 0.5V. Therefore, in the lowest power consumption mode (a "power-down" mode), a non-rail voltage is not maintained, and all nodes may be either pulled up to 1.0V or down to 0V.

Generally, during power-up of a circuit, greater power is consumed to obtain a non-rail voltage in less time. For example, a circuit may be configured to obtain the desired non-rail voltage ("operating point") in minimal time, but may also consume excessive power during normal operation and cause a supply collapse by requiring a large current surge during the power-up. Further, in order to keep noise immunity, additional bypass capacitance may be placed from a bias line to a supply rail, further slowing down the activation of the bias line. Thus, to conserve operating power and maintain integrity of the supply, typical circuits generating non-rail voltages exhibit a relatively slow power-on process.

Further, typical bias circuits exhibit substantial capacitance at the supply node. Due to the inductance of the supply line and on-chip capacitance to reduce noise between the supply rails, any change in current to the bias circuit will induce a ringing in the supply voltage. The "severity" of the ringing will be dependent upon the magnitude of the current change, the speed of the surge, the value of the inductance and effective capacitance, and other factors.

On-chip frequency to current (F2I) circuits represent a specific class of bias circuits that are typically used to generate a frequency related current for other circuits. In some instances, a digitized F2I circuit may utilize a switched-cap scheme to maintain and settle the operating point of the F2I with a delta-modulator-based control system. As with conventional F2Is, this sort of digitized F2I circuit is heavily bypassed for noise filtering, thereby exacerbating the maintenance power issue as well as the length of time required to reach steady state.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure address systems, methods, devices, and circuits for fast settling of a bias node. Consistent with some embodiments, a bias circuit may include a successive-approximation-register-analog-to-digital converter (SAR-ADC) based settling loop configured to perform a fast settling process for a heavily loaded bias node. The SAR-ADC based loop performs a SAR-ADC process that includes measuring a reference (current or voltage) to determine a number of cells in a capacitor array that are involved in a charge sharing process while simultaneously completing the settling process for the bias node.

Conventional bias circuits often have either a current reference or voltage reference for building a non-rail operating point voltage. For these conventional bias circuits, once the non-rail operating point voltage settles, the output is either equal to or at least proportional to the reference current or voltage. For high-efficiency power delivery of charge sharing between two capacitors, if a capacitor array is added to tune the voltage of the bias node by sharing its charge with the heavily loaded capacitor of the node, the capacitor array and the biased transistor will form a very fast digital-to-analog converter (DAC), which can output a current or a voltage that equals or approximates the reference. Further, by having the capacitor array provide the current to settle the operating point, this sort of charge sharing scheme eliminates large current surges in the supply, thereby improving upon power integrity issues introduced by conventional bias circuits.

It shall be appreciated that while certain embodiments described in the present disclosure may find particular application in bias circuits, the inventive subject matter is not limited to bias circuits. Rather, the inventive subject may be applied to the start-up of any internally generated voltage. For example, an on-chip regulator may be configured in accordance with the description that follows to generate a given voltage. Additionally, those of ordinary skill in the art will appreciate that certain embodiments described in the presented disclosure may be implemented with minimal implementation cost as they may be implemented with minimal circuitry that occupies minimal on-chip area and power.

Figure 1:
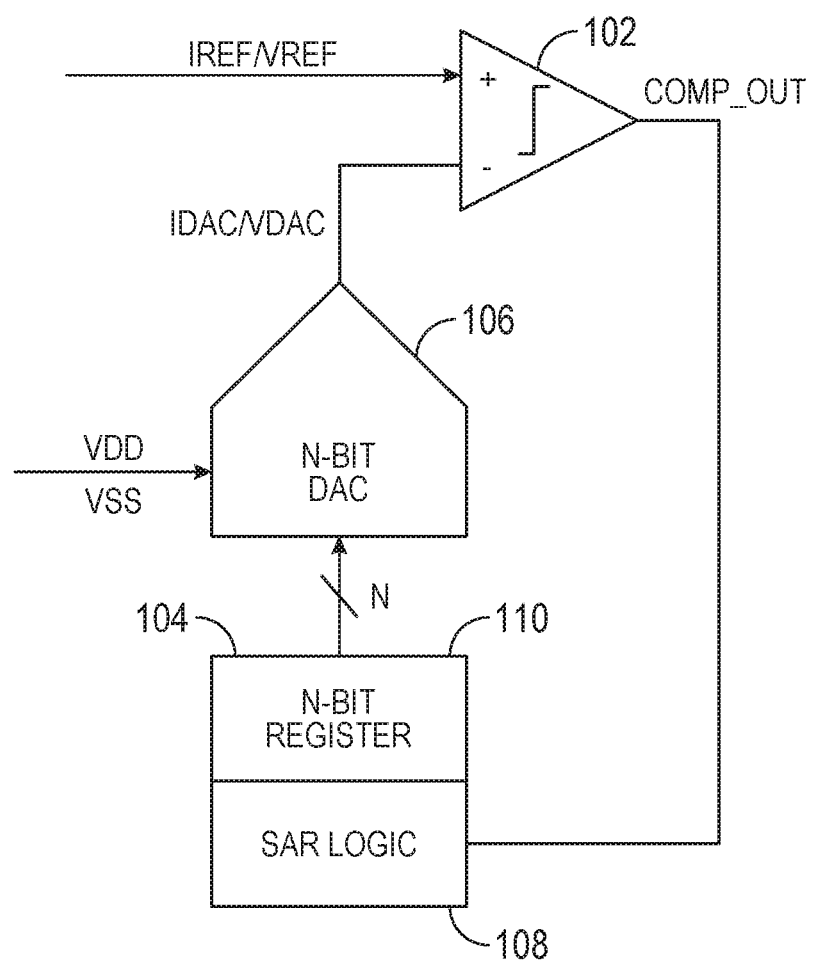
FIG. 1 is a block diagram illustrating successive-approximation-register-analog-to-digital converter (SAR-ADC) feedback loop, according to some example embodiments.

With reference to FIG. 1, a SAR-ADC feedback loop 100 is shown, according to some example embodiments. As shown, the feedback loop 100 comprises a comparator 102, an SAR component 104, and an N-bit DAC 106. At its input, the feedback loop 100 receives a reference voltage (VREF) or a current reference (IREF). The voltage or current reference is connected to an input of the comparator 102. The comparator 102 compares the reference voltage or current with an output voltage or current (VDAC or IDAC) provided by the N-bit DAC 106, and provides a digital output signal (COMP_OUT) based on a result of the comparison. In particular, the output signal COMP_OUT of the comparator 102 indicates which input signal is larger.

In some embodiments, the comparator 102 may comprise a sampler, while in other embodiments, the comparator 102 may not include a sampler. For example, in implementations where the reference (IREF or VREF) is constant, the comparator 102 may not include a sampler. However, in implementations where it is desired to have the DAC 106 output voltage or current (VDAC or IDAC) be a sawtooth or other periodic signal, the comparator 102 may include a sampler to pick a peak voltage value. In these implementations, the sampler may, for example, be implemented using a digital buffer or inverter followed by a D flip-flop. The buffer or invertor compares the peak value of an internal voltage Vint with its own turnover voltage (e.g., a self-built voltage reference), and the following D flip-flop samples the output from the buffer or invertor with the same clock phase with which the DAC 106 generates a sawtooth-like pulse. Additionally, in implementations where the comparator 102 is to compare a reference current (IREF) to an output current (Iout), a current mirror may be used to implement the comparator 102.

The N-bit DAC 106 converts a N-bit digital input signal into the output voltage or current (VDAC or IDAC) signal that is passed on as input to the comparator 102. Accordingly, the DAC 106 may be either a voltage DAC or a current DAC. The number of bits "N" in the input signal may be any positive non-zero integer and may be adjusted based on circuit specification constraints for bias operating range and final settling precision.

The N-bit DAC 106 is also connected to a reference voltage. In some embodiments, a rail voltage (Vdd/Vss) provided by an on-chip power supply may be used as the reference voltage for the N-bit DAC 106. Further, in some embodiments, the N-bit DAC 106 may be implemented with a capacitive DAC that provides fast settling through charge sharing with a capacitor of a bias node.

The key design parameters of the DAC 106 (e.g., capacitance and number of bits N) may be determined based on the output range and the output precision of the DAC 106. That is to say, if the final output IDAC/VDAC needs a large level range, a large number of bits and a high capacitance may be used. If, on the other hand, the final output IDAC/VDAC needs high precision that approximates to reference current or voltage, a small capacitance for the least significant bit (LSB) may be used to achieve this, though there may be some tradeoffs with area and power consumption.

Figure 2:
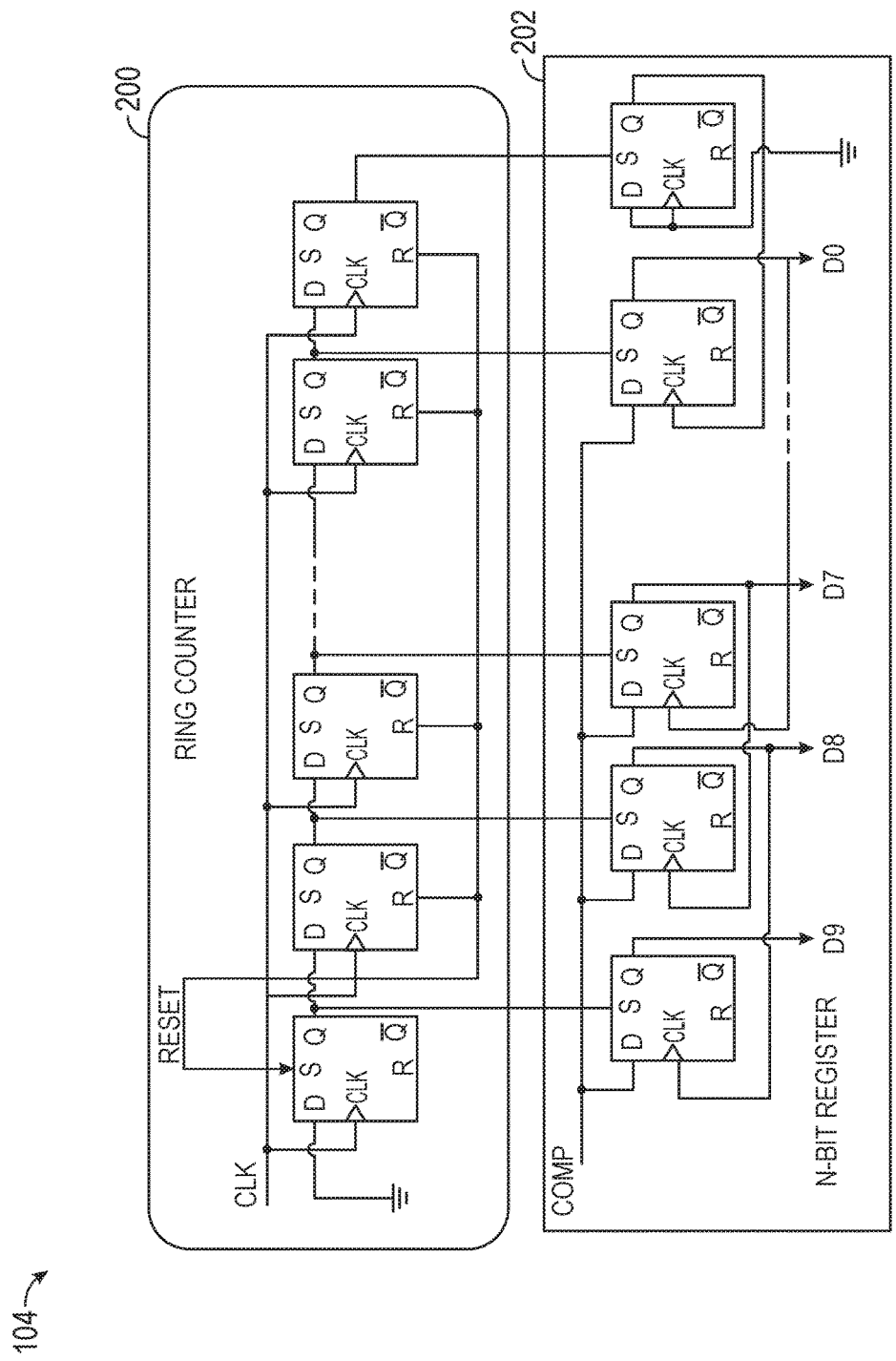
FIG. 2 is a circuit diagram illustrating a SAR component, which is included as part of the SAR-ADC feedback loop, according to some example embodiments.

The output of the comparator 102 (COMP_OUT) is connected to the SAR component 104. The SAR component 104 comprises SAR logic 108 and an N-bit register 110. The SAR logic 108 may be implemented, for example, using logic cells (e.g., set-reset D flip-flops) configured to implement a successive approximation algorithm that is similar to conventional SAR-ADC circuits that utilize the binary search algorithm. However, unlike the conventional SAR-ADC, the SAR logic 108 provides an initial charge sharing period and subsequent period of normal operation. For example, as shown in FIG. 2, the SAR logic 108 may be implemented with a ring counter 200 and the N-Bit register 110 may be implemented with a code register 202. Although the embodiment of the SAR component 104 illustrated in FIG. 2 separates the design of the SAR logic 108 and an N-bit register 110, thereby leading to the use of 2*N flip-flops, in other embodiments, the SAR component 104 may be implemented in a non-redundant manner so as to combine the SAR logic 108 and the N-bit register 110, thereby employing only a minimum number of flip-flops (N flip-flops).

Returning to FIG. 1, once the feedback loop 100 circuit is enabled, the SAR logic 108 configures a capacitor array in the DAC 106 so as to successively set each bit value in the N-bit digital input signal from the most significant bit (MSB) to the LSB to either "high" (i.e., a digital 1) or "low" (i.e., a digital 0) depending on the output signal COMP_OUT from the comparator 102. In setting each bit value, the SAR logic 108 establishes a charge on a corresponding capacitor in the capacitor array based on the output from the comparator 102. After each bit value is set, the SAR logic 108 ties the corresponding capacitor to a bias node to charge or discharge the bias node through share charging. After the LSB is set, the N-bit register 110 records the N-bit digital input signal of the DAC 106. The digital input signal recorded in the register 110 can be used directly for any later power-on process to enable a faster settling as long as there are no significant environment changes for the bias circuit such as the supply, temperature, humidity, etc.

Figure 3:
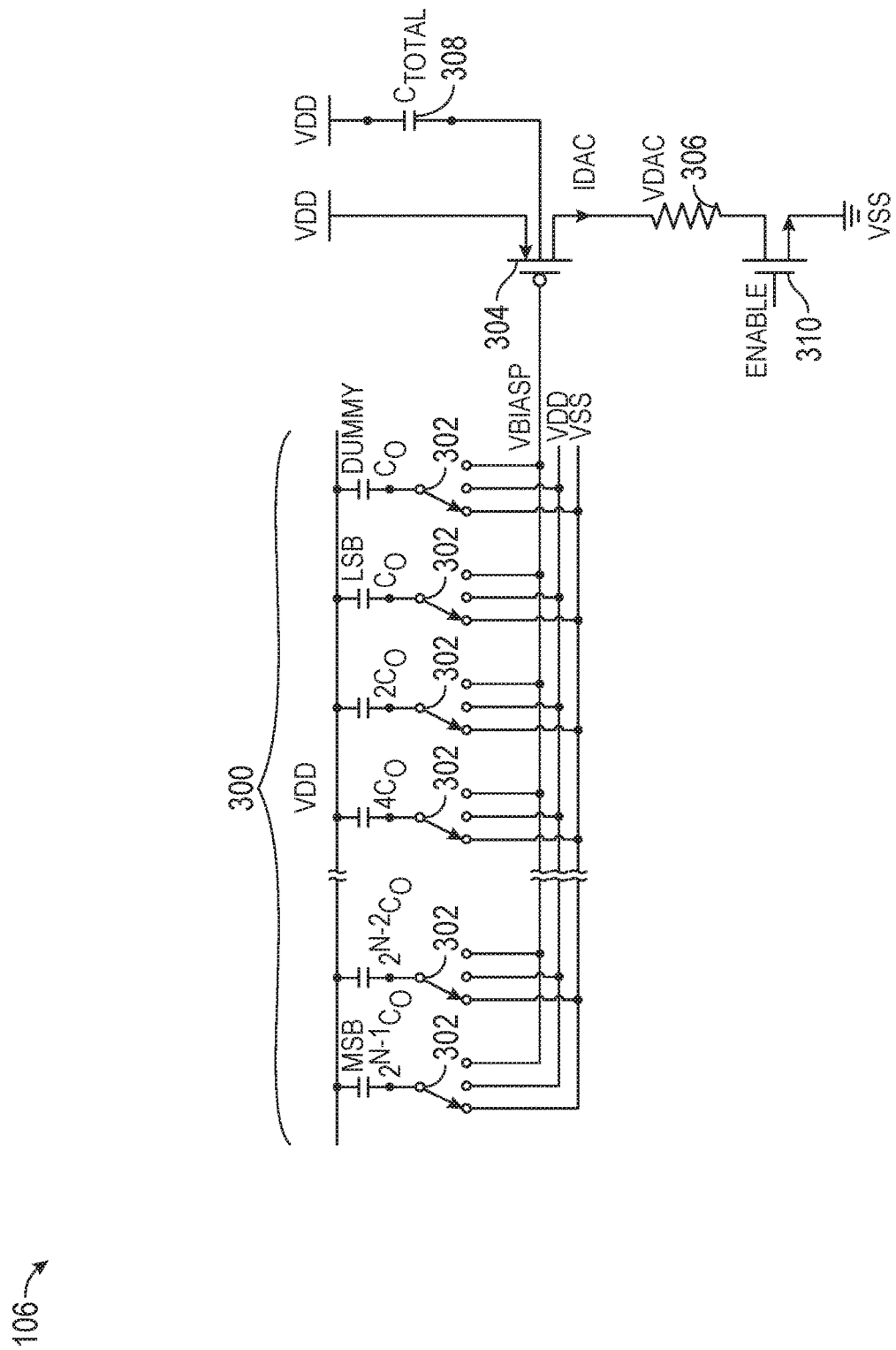
FIG. 3 is a circuit diagram illustrating a digital-to-analog converter (DAC), which is included as part of the SAR-ADC feedback loop, according to some example embodiments.

FIG. 3 is a circuit diagram illustrating components of the n-bit DAC 106, according to some example embodiments. As shown, the DAC 106 comprises an ordered capacitor array 300 with N-capacitors, where "N" is the number of bits in the output signal of the SAR component 104. With the exception of the rightmost capacitor, each capacitor in the capacitor array 300 corresponds to a bit and the charge of each capacitor corresponds to the bit value. As shown, the leftmost capacitor in the capacitor array 300 corresponds to the MSB, and the second to last capacitor from the left corresponds to the LSB.

The capacitors in the capacitor array 300 are weighted in accordance with the capacitances illustrated in FIG. 3. For example, the capacitor corresponding to the LSB has a capacitance of $C_0$, whereas the capacitance of the capacitor corresponding to the MSB is $2^{N-1}C_0$.

The DAC 106 further comprises N-tristate selector-switches 302. Each of the N-capacitors is connected to one of the N-tristate selector-switches 302. More specifically, each capacitor in the ordered capacitor array 300 is connected between a positive supply voltage Vdd and a tristate selector-switch 302. Depending on its position, each tristate selector switch 302 connects a corresponding capacitor from the ordered capacitor array 300 to the positive supply voltage Vdd, a negative supply voltage Vss (e.g., ground), or the bias node Vbiasp.

The DAC 106 also comprises a transconductance stage following the capacitor array 300. The transconductance stage comprises a P-type metal-oxide-semiconductor (PMOS) transistor 304 with its gate terminal connected to the bias node Vbiasp (e.g., a heavily capacitive loaded node). The PMOS transistor 304 outputs, at the drain terminal, both the output current IDAC and the output voltage VDAC (using resistor 306). In some implementations, the output current IDAC and the output voltage VDAC may be designed or set to be equal to the reference current IREF or the reference voltage VREF, respectively.

In operation, capacitive cells of the n-bit capacitor array 300 are successively configured to set bit values from the MSB to the LSB. Once an enable signal is received at the enable device 310, the SAR logic 108 switches each switch 302 to either Vdd or Vss to establish a charge on the corresponding capacitor in the capacitor array 300 to establish the capacitor's bit value. The charge supplied to each capacitor (either Vdd or Vss) is determined by the current relationship between the DAC 106 output (either IDAC or VDAC) and the reference (either IREF or VREF). Once the charge is stored in a capacitor, the SAR logic 108 switches the corresponding switch 302 to Vbiasp to charge or discharge the bias node through charge sharing. Upon setting the bit value of each capacitor in the capacitor array 300, the SAR logic 108 decouples each capacitor from the bias node and connects each to Vss.

As shown, a capacitor 308 with capacitance $C_{total}$ is connected between Vdd and the gate terminal of the PMOS transistor 304. In the context of FIG. 3, $C_{total}$ represents all capacitors loaded on the bias node including bypass and parasitic capacitors.

Figure 4:
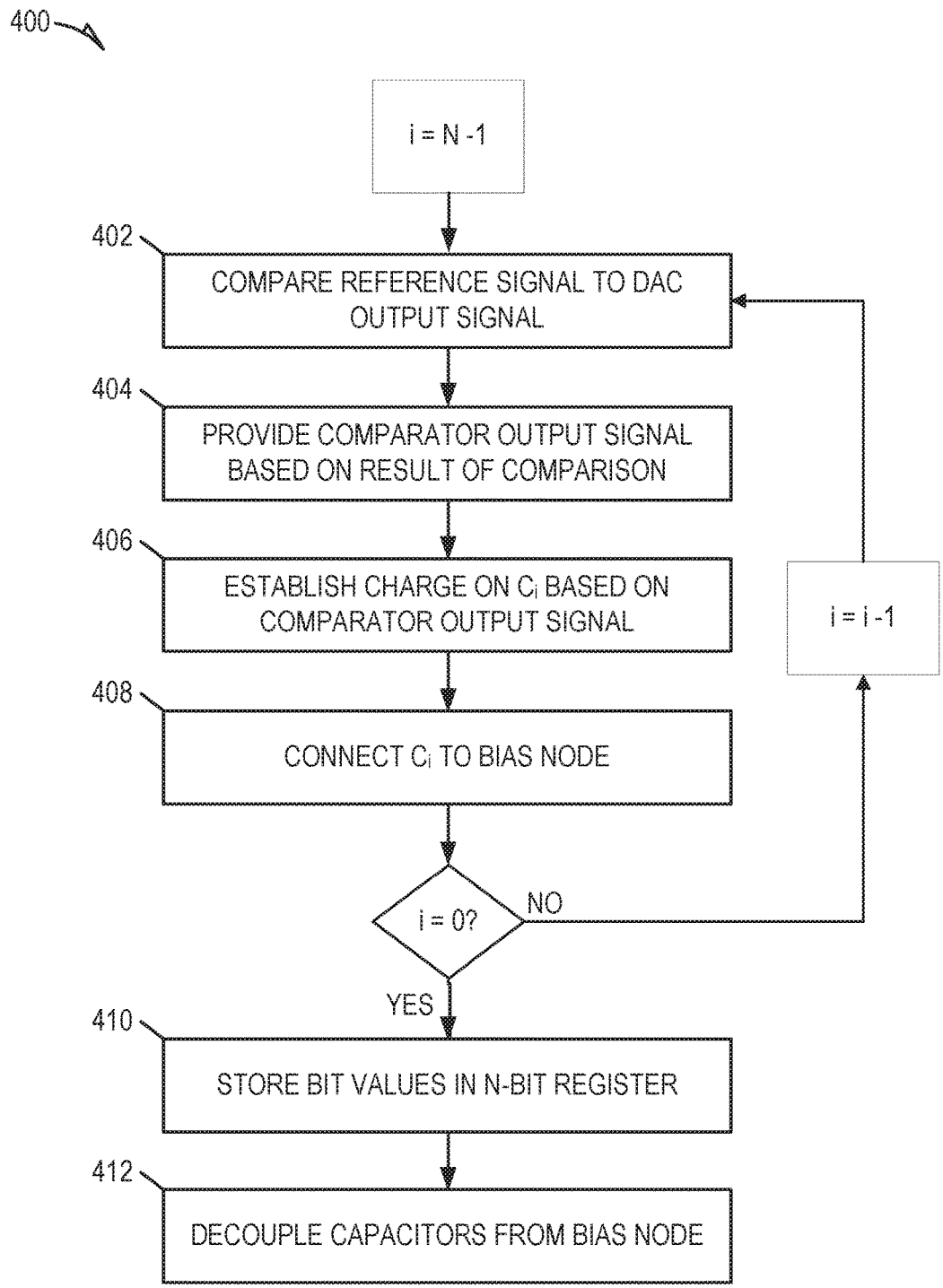
FIG. 4 is a flow diagram illustrating operations of the SAR-ADC feedback loop in performing a method for fast settling, according to some example embodiments.

FIG. 4 is a flow diagram illustrating operations of the SAR-ADC feedback loop 100 in performing a method 400 for fast settling, according to some example embodiments. The method 400 begins once the SAR-ADC feedback loop 100 is enabled (e.g., by receiving an enable signal). In the context of method 400, operations 402-408 are repeated for each capacitor in the capacitor array 300 starting from the capacitor corresponding to the MSB on through the capacitor corresponding LSB. In FIG. 4 and the discussion that follows, "i" is used as a counter for the capacitors of the capacitor array 300 to track the process. Initially, "i" is set to "N−1," where "N" is the number of capacitive cells in the capacitor array 300, and also corresponds to the number of bits in the output signal of the SAR component 104 provided to the DAC 106.

At operation 402, the comparator 102 compares the reference signal (current reference IREF or voltage reference VREF) to the signal received from the DAC 106 (output current IDAC or output voltage VDAC). At operation 404, the comparator 102 provides the output signal COMP_OUT based on a result of the comparison. In particular, the output signal COMP_OUT provided by the comparator 102 indicates whether the reference or the DAC output is larger.

At operation 406, the SAR logic 108 establishes a charge on capacitor $C_i$ in the capacitor array 300 of the DAC 106 based on the output signal provided by the comparator 102. The SAR logic 108 establishes the charge on the capacitor $C_i$ by changing the position of the switch connected to the lower terminal of the capacitor $C_i$ to either the positive supply voltage Vdd or the negative supply voltage Vss. For example, if COMP_OUT is "1," the SAR logic 108 connects $C_i$ to Vss by switching the corresponding switch 302 to the position corresponding to Vss. If COMP_OUT is "0," the SAR logic 108 connects $C_i$ to Vdd by switching the corresponding switch 302 to the position corresponding to Vdd.

At operation 408, the SAR logic 108 connects $C_i$ to Vbiasp by switching the corresponding switch 302 to the position corresponding to Vbiasp to charge or discharge the bias node through charge sharing. If there are further capacitors in the capacitor array 300 (i>0), the counter "i" is decremented by 1 (i=i−1) and the method returns to operation 302 where the process is repeated for the next capacitor in the array 300.

If there are no further capacitors to charge (i=0), SAR logic 108 reads the bit values from the capacitor array 300 and stores them in the register 110, at operation 410. The SAR logic 108 may use the bit values stored in the register 110 to configure the DAC 106 during the next start up event. This will allow the SAR-ADC based feedback loop 100 to be quickly returned to an operational power state with minimal cost. Further, because the SAR-ADC based feedback loop 100 can be brought back so quickly, it may be disabled or placed in low power mode as needed to save power.

At operation 412, the SAR logic 108 decouples the capacitors from the bias node by resetting the switch positions of the tri-state switches 302 to the negative supply voltage Vss (e.g., ground) so as to connect the lower terminal of each capacitor in the capacitor array 300 to Vss.

Figure 5:
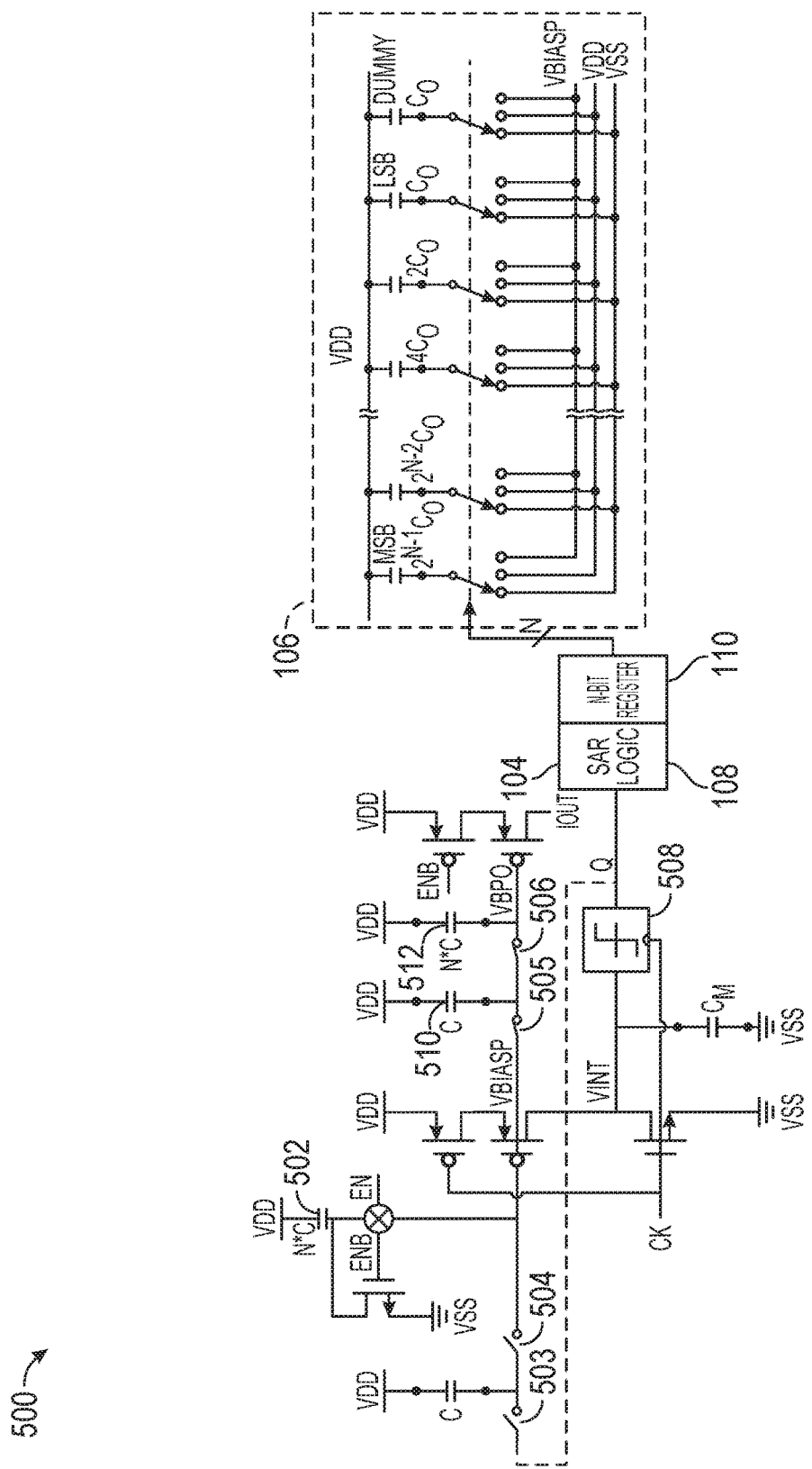
FIG. 5 is a circuit diagram illustrating a bias circuit implemented using the SAR-ADC feedback loop, according to some example embodiments.

FIG. 5 is a circuit diagram illustrating a F2I converter circuit 500 implemented using the SAR-ADC based feedback loop 100, according to some example embodiments. In power down mode, capacitor 502 in the modulating loop is tied to the negative supply voltage Vss, the bias node Vbiasp is tied high as a result of switches 503-506 being in the closed position (on) and output Q from quantizer 508 being set high. During the power on period, switches 503 and 504 switch open (off) while switches 505 and 506 remain closed (on). The loop-in capacitance N*C (from capacitor 502) shares its charge with a loop-out capacitance (N+1)*C (from parallel capacitors 510 and 512) once the "Enable" signal goes high. Further, with switches 505 and 506 closed (on), the bias node Vbiasp is tied to the bias node Vbpo, which generates an output current Iout.

The capacitance (N+1)*C is distributed on the conductive path between Vbiasp and Vbpo. Resistance from the switches 505 and 506 may slow down the charge sharing process, although this may be addressed by allowing sufficient time for the charge sharing and/or larger sized switches for switches 505 and 506.

Although the embodiments of the present disclosure have been described with reference to specific example embodiments, it will be evident that various modifications and changes may be made to these embodiments without departing from the broader scope of the inventive subject matter. For example, while the example embodiments described above are described as being implemented with PMOS loads as current mirrors, it shall be appreciated that in alternate embodiments, n-type metal-oxide-semiconductor (NMOS) or other transistor types may be used. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A bias circuit comprising:
   a comparator having a first comparator input, a second comparator input, and a comparator output, the comparator to provide a comparator output signal at the comparator output based on a comparison between the first and the second comparator inputs, the first comparator input being connected to a reference that provides a reference signal;
   an N-bit digital-to-analog convertor (DAC) having a DAC input and a DAC output, the DAC output being connected to the second comparator input to provide a DAC output signal to comparator based on an N-bit digital input signal, the N-bit DAC comprising a plurality of tristate switches and a capacitor array comprising a plurality of capacitors, each tristate switch of the plurality of tristate switches configured to selectively establish a connection of one of the plurality of capacitors to a positive supply voltage, a negative supply voltage, and a common bias node of the N-bit DAC in a first state, second state, and third state of the switch, respectively; and
   a successive approximation register (SAR) component connected to the DAC input and comprising SAR logic and an N-bit register, the SAR component being connected to the comparator output to receive the comparator output signal, the SAR logic to successively set each bit value of the N-bit digital input signal based on the comparator output signal and to charge or discharge the common bias node of the N-bit DAC upon setting each bit value by configuring a tristate switch of the plurality of tristate switches to connect the common bias node to a capacitor in the capacitor array that corresponds to the set bit value, the N-bit register to store the N-bit digital input signal.

2. The bias circuit of claim 1, wherein each bit in the N-bit digital input signal has a corresponding capacitor in the capacitor array.

3. The bias circuit of claim 2, wherein the SAR logic sets each bit value of the N-bit input signal by establishing a charge on the corresponding capacitor in the capacitor array.

4. The bias circuit of claim 3, wherein the SAR logic establishes the charge on the corresponding capacitor by connecting the capacitor to either the positive supply voltage or the negative supply voltage.

5. The bias circuit of claim 4, wherein the SAR logic is further to decouple each capacitor from the positive or negative supply voltage in response to the N-bit register storing the N-bit input signal.

6. The bias circuit of claim 1, wherein the N-bit DAC further comprises:
   a transistor comprising a gate terminal and a drain terminal, the gate terminal being connected to the common bias node, the transistor to provide the DAC output signal at the drain terminal; and
   an enable device connected to the drain terminal of the transistor, the enable device to receive an enable signal to enable the N-bit DAC.

7. The bias circuit of claim 1, wherein the SAR logic comprises a plurality of logic cells configured to implement a successive approximation algorithm.

8. The bias circuit of claim 1, wherein the reference signal is a reference voltage or a reference current.

9. The bias circuit of claim 1, wherein the N-bit DAC is configured to convert the N-bit digital signal to an analog signal, the analog signal corresponding to the DAC output signal.

10. A method for settling a bias circuit, the method comprising:
    comparing a reference signal to a digital-to-analog convertor (DAC) output signal provided by a DAC, the DAC comprising a plurality of tristate switches and a capacitor array comprising a plurality of capacitors, each tristate switch of the plurality of tristate switches configured to selectively establish a connection of one of the plurality of capacitors to a positive supply voltage, a negative supply voltage, and a common bias node of the N-bit DAC in a first state, second state, and third state of the switch, respectively;
    successively setting each bit value in an N-bit digital input signal of the DAC based on a result of the comparison;
    upon setting each bit value in the N-bit digital input, charging or discharging the common bias node in accordance with a corresponding bit value by configuring a tristate switch of the plurality of tristate switches to connect the common bias node to a capacitor in the capacitor array corresponding to the bit value; and
    storing each bit value in the N-bit digital input in an N-bit register.

11. The method of claim 10, wherein each bit in the N-bit digital signal has a corresponding capacitor in the capacitor array, wherein the setting of each bit value of the N-bit input signal includes setting a first bit value by establishing a charge on capacitor in the capacitor array that corresponds to the first bit value.

12. The method of claim 11, wherein the establishing of the charge on the capacitor that corresponds to the first bit value comprises connecting the capacitor to either the positive supply voltage or the negative supply voltage based on a result of the comparison.

13. The method of claim 12, decoupling each capacitor from the positive or negative supply voltage in response to the N-bit register storing the N-bit input signal.

14. The method of claim 10, wherein the DAC includes the bias node.

15. The method of claim 10, wherein the reference signal is a reference voltage or a reference current.

16. The method of claim 10, further comprising using the N-bit signal stored in the N-bit register to configure the DAC upon a subsequent start up.

17. A device for settling a bias circuit, the device comprising:
 a successive approximation register (SAR) logic to successively set each bit value in an N-bit digital input signal of digital-to-analog converter (DAC) based on a result of a comparison of a reference signal and a DAC output signal provided by the DAC, the DAC comprising a plurality of tristate switches and a capacitor array comprising a plurality of capacitors, each tristate switch of the plurality of tristate switches configured to selectively establish a connection of one of the plurality of capacitors to a positive supply voltage, a negative supply voltage, and a common bias node of the N-bit DAC in a first state, second state, and third state of the switch, respectively, the SAR logic further to charge or discharge the common bias node upon setting each bit value in the N-bit digital input by configuring a tristate switch of the plurality of tristate switches to connect the common bias node to a capacitor in the capacitor array corresponding to the bit value; and
 an N-bit register to store the N-bit input signal.

18. The device of claim 17, wherein each bit in the N-bit digital signal has a corresponding capacitor in the capacitor array, wherein the setting of each bit value of the N-bit input signal includes setting a first bit value by establishing a charge on a capacitor in the capacitor array that corresponds to the first bit value.

19. The device of claim 18, wherein the establishing of the charge on the capacitor that corresponds to the first bit value comprises connecting the capacitor to either the positive supply voltage or the negative supply voltage based on a result of the comparison.

* * * * *